Nov. 22, 1960 G. A. NEFF 2,961,614

ELECTRICAL SIGNAL AMPLIFIER

Filed Sept. 30, 1957 2 Sheets-Sheet 1

INVENTOR.
GLYN A. NEFF
BY Robert H. Fraser
ATTORNEY.

Nov. 22, 1960 G. A. NEFF 2,961,614

ELECTRICAL SIGNAL AMPLIFIER

Filed Sept. 30, 1957 2 Sheets-Sheet 2

INVENTOR.
GLYN A. NEFF

BY Robert H. Fraser

ATTORNEY.

United States Patent Office 2,961,614

Patented Nov. 22, 1960

2,961,614

ELECTRICAL SIGNAL AMPLIFIER

Glyn A. Neff, Pasadena, Calif., assignor, by mesne assignments, to Neff Instrument Corporation, Wilmington, Del., a corporation of Delaware Filed Sept. 30, 1957, Ser. No. 687,041

5 Claims. (Cl. 330—10)

Figure 1:
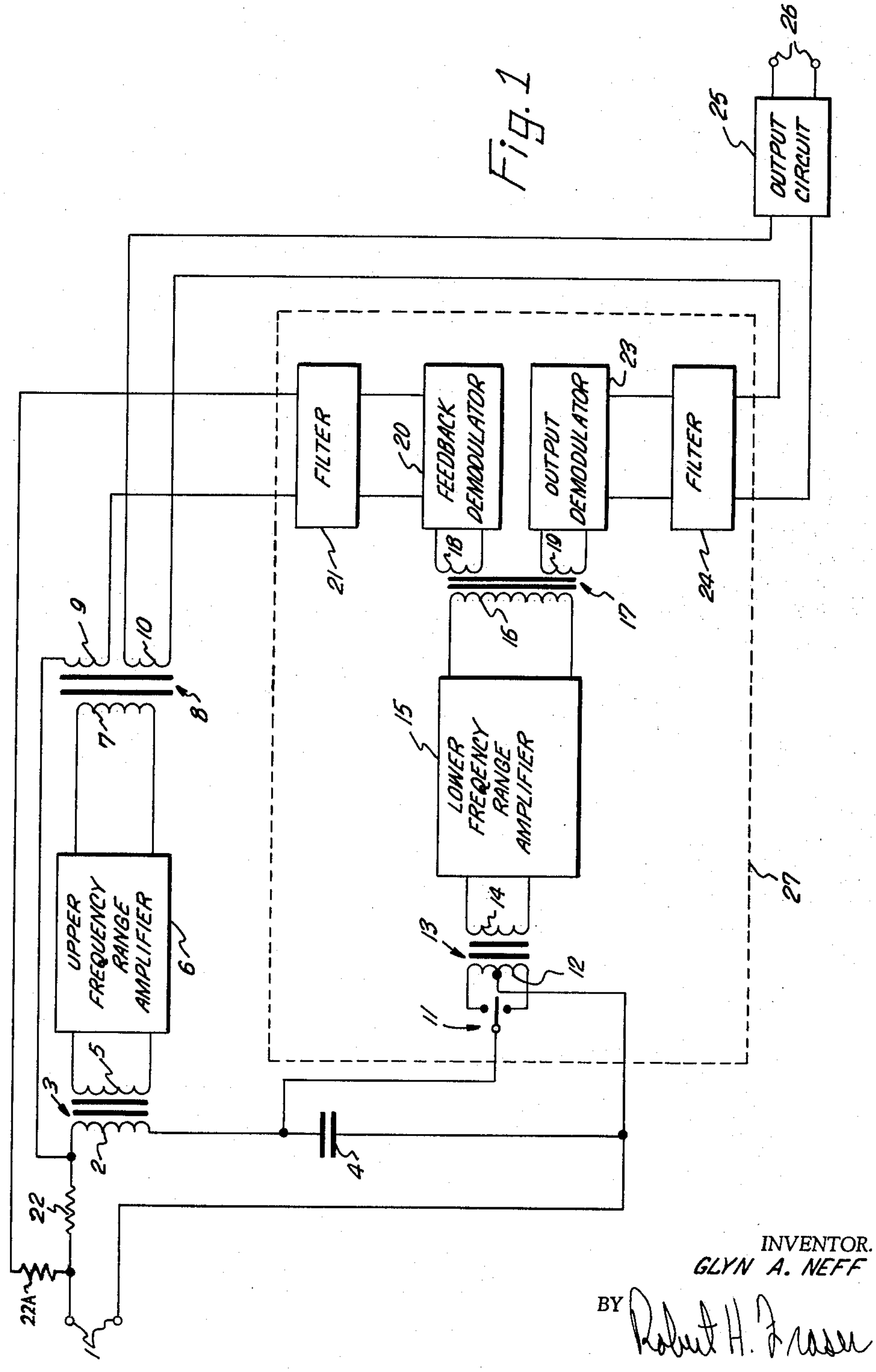

This invention relates to electrical signal amplifiers and more particularly to an electrical signal amplifier for amplifying electrical signals having unidirectional and alternating signal components.

Electrical signal amplifiers are frequently employed to generate relatively strong output signals corresponding to relatively weak input signals. The input signals in some instances contain both unidirectional components and alternating signal components. That is, the frequency range of the input signal may vary from zero to a substantially high number of alternations per second.

Conventional electrical signal amplifiers are generally coupled between stages for alternating current signals only, so that signal components of relatively low frequency and unidirectional components are lost in the amplification process. Although direct coupled amplifiers may be used in which the unidirectional components are coupled from stage to stage along with the alternating current components, it is well known that the overall gain of direct coupled amplifiers tends to be unstable since the aging of the electron tubes and components affects the overall gain of the amplifier. An additional disadvantage of direct coupled amplifiers is that each succeeding amplification stage generally must be elevated in electrical potential because the direct coupling between amplification stages applies the operating voltage from each stage to the next successive stage.

In an effort to avoid the aforementioned difficulties, signals having unidirectional components may be converted to alternating current signals in the form of a modulated carrier wave which is amplified by a conventional alternating current amplifier which need not be direct coupled between amplification stages. If a unidirectional output signal is desired the amplified carrier wave may be demodulated to recover the signals.

It is well known that the stability of an amplifier in which a unidirectional signal is converted to an alternating current signal for amplification may be increased by including a negative feedback circuit which applies a portion of an output signal to an input circuit in a direction which tends to reduce an input signal. However, where a feedback circuit is connected between an output circuit and an input circuit the result is that the input circuit is electrically connected to the output circuit. Where the input circuits and output circuits are to be maintained at different biasing potentials or where the input circuits of several amplifiers sharing a common output circuit must be electrically separate, it is essential that no electrical connection be made via a feedback circuit between input and output circuits.

To provide isolated input circuits and output circuits where a feedback circuit is required, a motor may be positioned in accordance with an output signal, and an electrical component, such as a potentiometer, may be linked to the motor and electrically connected in the feedback circuit. By means of the potentiometer, a feedback voltage is provided without electrically connecting the feedback circuit and the output circuit. Where the output circuit must be electrically separated from both the amplifier and the feedback circuit, an additional potentiometer may be linked to the motor which is positioned to generate an output signal.

In any system in which a mechanical linkage is included to isolate the input, output and feedback circuits, the elements of the mechanical linkage possess a certain amount of inertia which limits the capability of the system as a whole to respond to relatively fast variations in the input signal. Accordingly, an amplifier which includes a mechanical linkage is not suitable where rapidly varying signals must be amplified.

In my co-pending application entitled "Electrical Signal Amplifiers," filed January 16, 1957, Serial Number 634,569, now Patent No. 2,832,848, an amplifier is described having electrically separate input and output circuits which is capable of amplifying signals having both unidirectional and alternating current signal components. Briefly, the amplifier of the co-pending application converts an input signal to a modulated alternating current carrier wave, the carrier wave is amplified, a feedback signal is derived from the carrier wave, and an output signal is derived in a circuit which is electrically separate from the amplifier input circuit.

Both the amplifier of the aforesaid co-pending application and conventional carrier type amplifiers suffer from the limitation that the upper frequency range is restricted by the carrier frequency. Accordingly, where a signal having a relatively wide band of frequency components is to be amplified, neither a direct coupled amplifier nor a carrier type amplifier is suitable. The problem is made additionally difficult where it is required that the input and output circuits be isolated from each other for the passage of direct currents as where different levels of biasing potentials are applied to the input and output circuits of a multiplicity of amplifiers, each of which must separately handle an electrical signal.

Accordingly, it is one object of the invention to provide a new and improved amplifier for handling electrical signals having a wide range of frequency components in which the input circuit and the output circuit are electrically isolated.

It is an additional object of the invention to provide a new and improved amplifier for handling differing frequency components of an electrical signal separately.

It is still another object of the invention to provide a new and improved amplifier in which both unidirectional and alternating feedback signals are derived from alternating current output signals.

In accordance with the invention, an amplifier is provided in which an input signal is divided into an upper frequency range and a lower frequency range. An upper frequency range amplifier is coupled to an input circuit for the passage of the upper frequency range signals only, and a lower frequency range amplifier is coupled for the passage of alternating current signals only to a converter which generates a modulated carrier wave in accordance with the lower frequency range signals. The output of the lower frequency range amplifier is coupled to means for demodulating the carrier modulated wave via a coupling which passes alternating signals only, a common feedback circuit is coupled to the demodulating means and the output of the upper frequency range amplifier for applying a composite feedback signal to the input circuit, and an output circuit is coupled to the upper frequency range amplifier and the demodulating means which is electrically isolated from the input circuit for the passage of unidirectional signal components.

Figure 2:
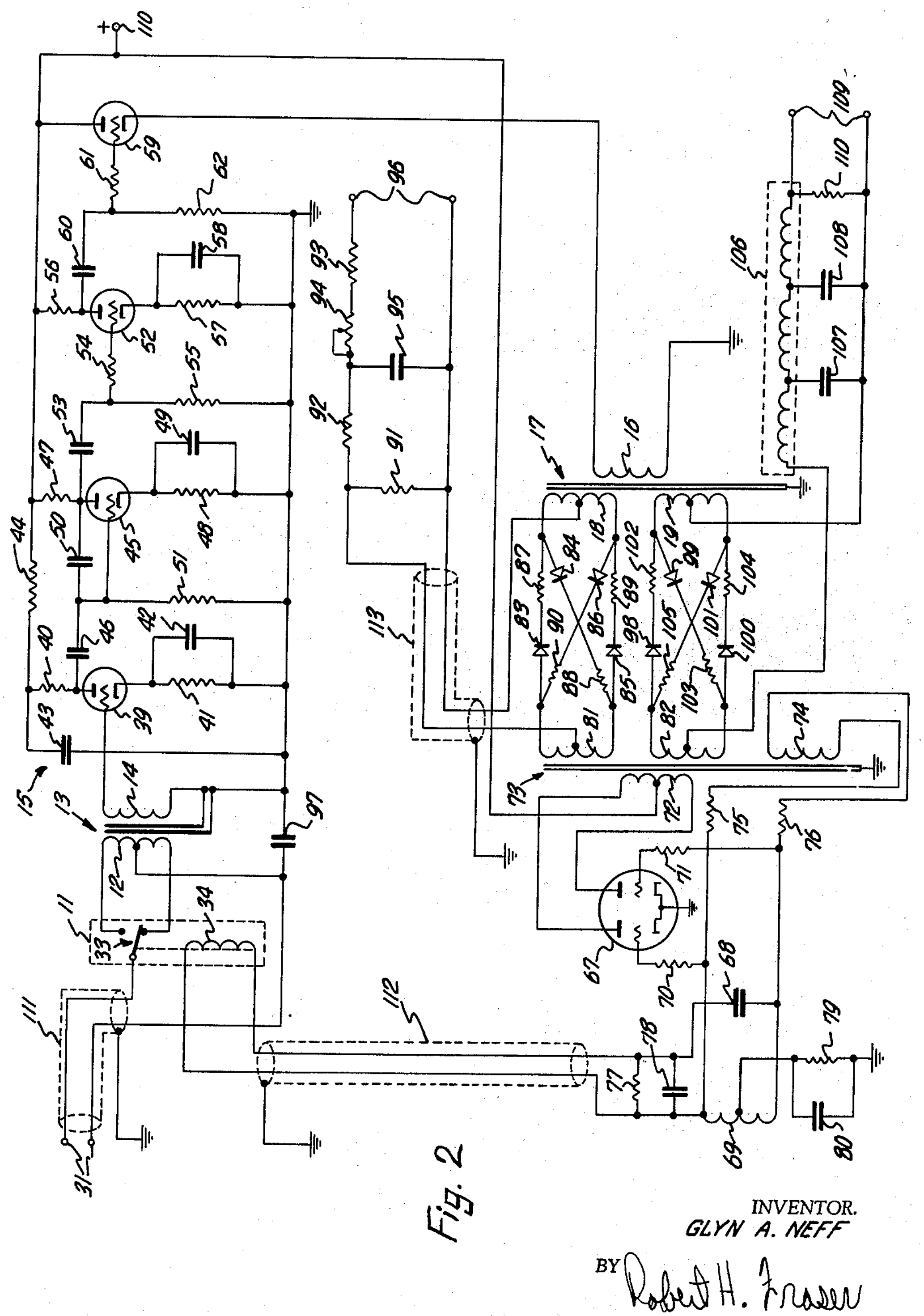

A better understanding of the invention may be had from the following detailed description and an inspection of the drawings, in which:

Fig. 1 is a combined block and schematic circuit digram of an amplifier including an embodiment of the invention; and Fig. 2 is a schematic circuit diagram of the portion of the apparatus of Fig. 1 enclosed within the dashed rectangle.

The amplifier of Fig. 1 is adapted to receive input signals at a pair of input terminals 1. The input signals may comprise a wide range of signals including very low frequency and unidirectional components as well as relatively high frequency components. The input signal applied to the terminals 1 appears across a frequency dividing network comprising an inductance provided by a primary winding 2 of a transformer 3 and a capacitor 4. Where the values of the inductance of the primary winding 2 and the capacitor 4 are properly chosen, the components of the input signal in an upper frequency range are coupled to a secondary winding 5 of the transformer 3 while components of the input signal in a lower frequency range appear across the capacitor 4. Since the transformer 3 functions to isolate the primary winding 2 from the secondary winding 5 for unidirectional signal components, only alternating current signals in the upper frequency range are applied to the input of an upper frequency range amplifier 6. The output signal from the upper frequency range amplifier 6 appears across a primary winding 7 of a transformer 8 having two secondary windings 9 and 10.

The lower frequency range components of the input signal appearing across the capacitor 4 are applied to a converter 11 which may comprise a conventional vibrator having a pair of single pole double throw contacts. The fixed contacts of the converter 11 are connected to a primary winding 12 of a transformer 13 across the secondary winding 14 of which appears a carrier wave having a frequency corresponding to the rate at which the converter 11 is operated and a varying amplitude corresponding to fluctuations in the signals appearing across the capacitor 4.

The modulated carrier wave bearing the low frequency range signals is applied to a lower frequency range amplifier 15. Amplified signals from the lower frequency range amplifier 15 are applied to a primary winding 16 of a transformer 17 having two secondary windings 18 and 19. The carrier modulated wave appearing across the secondary winding 18 is applied to a feedback demodulator 20 which functions to recover the lower frequency range signals from the carrier wave.

A common feedback circuit is connected between the output of the upper frequency range amplifier 6 and the feedback demodulator 20 via a filter 21. By connecting the secondary winding 9 serially with the output of the feedback demodulator 20 a composite feedback signal is provided across a voltage divider including a resistor 22A and a feedback resistor 22 in the input circuit. The type of feedback employed is negative or inverse feedback in which the sense of the feedback signal appearing across the feedback resistor 22 is subtractive with respect to the signal applied to the terminals 1. Since the feedback circuit is electrically isolated for unidirectional components, the input circuit is capable of being electrically biased with the entire feedback circuit floating along with the input circuit at any selected unidirectional potential.

In order to provide an output signal, an output demodulator 23 derives the lower frequency range components from the amplified carrier wave appearing across the secondary winding 19. The unidirectional components appearing at the output demodulator 23 are combined with the amplified upper frequency range components appearing across the secondary winding 10 of the transformer 8. A filter 24 may be included in the circuit to restrict the passage of the carrier wave and to smooth the lower range signals from the output demodulator 23. The combined amplified output signals may be applied to an output circuit 25 which is connected to a pair of output terminals 26.

Since the output circuit is electrically isolated from all other portions of the circuit of Fig. 1 for unidirectional signal components by the transformers 8 and 17, the entire output circuit is capable of being biased and floats free of both the feedback circuit and the input circuit. Consequently, a plurality of amplifiers similar to Fig. 1 may be employed in which any selected output circuit or any selected input circuit may be shared with one or more other amplifiers or separated from one or more amplifiers without any adverse effect arising due to the passage of unidirectional voltages between the circuits.

In Fig. 2 there is shown a schematic circuit diagram of the portion of the apparatus of Fig. 1 enclosed within the dashed rectangle 27. In general, the construction and operation of the apparatus of Fig. 2 is similar to that of the amplifier described in my aforesaid co-pending patent application, except that the feedback and output circuits are adapted to be connected in common with corresponding circuits of the upper frequency range amplifier 6 of Fig. 1.

In the apparatus of Fig. 2, an input signal from the capacitor 4 of Fig. 2 may be applied to a pair of terminals 31. An input circuit to which the terminals 31 are connected includes a converter 11 in the form of a vibrator-type circuit interrupter having a set of single pole double throw switch contacts 33 and an actuating coil 34. When the actuating coil 34 is energized with alternating current, the switch contacts 33 open and close to connect one of the input terminals 31 alternately to opposite ends of the primary winding 12 of the transformer 13. A center tap on the primary winding 12 is returned to the other of the input terminals 31.

Due to the application of the input signal alternately to opposite ends of the primary winding 12, an alternating current signal appears across the secondary winding 14 of the transformer 13 which is amplitude modulated in accordance with the signal applied to the terminals 31. In addition, the alternating current signal appearing across the secondary winding 14 bears a phase relationship to the alternating current wave applied to the actuating coil 34 which corresponds to the polarity of the input signal. That is, for a positive input signal the alternating current signal is of one phase, and for a negative input signal the alternating current signal is of opposite phase.

The alternating current signal from the secondary winding 14 is applied to the control electrode of an amplifier electron tube 39 which forms the first stage of the lower frequency range amplifier 15. Operating voltage is applied to the anode of the electron tube 39 via a load resistor 40. A conventional cathode resistor 41 and a by-pass capacitor 42 are connected in parallel to the cathode of the electron tube 39. A decoupling capacitor 43 maintains the end of the load resistor 40 away from the electron tube 39 at substantially A.C. ground potential and a resistor 44 is connected serially with the load resistor 40 to isolate the amplifier tube 39 from the remainder of the circuit.

At the anode of the electron tube 39 an alternating current signal appears which is passed to the control electrode of a second amplifier electron tube 45 via a coupling capacitor 46. A conventional load resistor 47 is connected to the anode of the electron tube 45 and a cathode resistor 48 and by-pass capacitor 49 are connected to the cathode of the electron tube 45. In addition, a capacitor 50 is connected between the anode and control electrode of the electron tube 45 to stabilize the amplifier circuit and eliminate parasitic oscillations. A conventional grid leak resistor 51 is connected between the control electrode of the electron tube 45 and ground reference potential.

The alternating current signal appearing at the anode of the electron tube 45 is applied to the control electrode of a third amplifier electron tube 52 via a coupling capacitor 53 and a grid current limiting resistor 54. A conventional grid leak resistor 55 returns the control electrode to ground reference potential, a load resistor 56 is connected to the anode, and a cathode resistor 57 and by-pass capacitor 58 are connected in parallel to the cathode of the electron tube 52.

The alternating current signal appearing at the anode of the electron tube 52 is passed to the control electrode of a cathode follower electron tube 59 via a coupling capacitor 60 and a grid current limiting resistor 61. The control electrode of the cathode follower electron tube 59 is returned to ground reference potential via the resistor 61 and a grid leak resistor 62.

In a conventional manner, operating voltage is applied directly to the anode of the cathode follower electron tube 59, and the primary winding 16 of the output transformer 17 is connected serially with the cathode of the electron tube 59. The circuit of the cathode follower electron tube 59 functions as an impedance matching device to couple the amplifier of the lower frequency range amplifier 15 to the low impedance load presented by the transformer 17.

The output transformer 17 includes two separate secondary windings 18 and 19, across each of which appears an alternating current signal. Connected to each of the secondary windings 18 and 19 is a separate synchronous demodulator which is adapted to compare alternating currents of the same frequency and provide an output signal as a result of the comparison. The synchronous demodulators are described in detail below.

An alternating current wave which is employed as a reference wave may be generated by means of an oscillator which includes a double-triode electron tube 67. A frequency determining tank circuit is included in the oscillator comprising a capacitor 68 and an inductance which is povided in part by a coil 69 and in part by the inductance of the coil 34 of the converter 11. In operation, the capacitor 68 and the coils 34 and 69 have a predetermined resonant frequency which may be for example, 400 cycles per second.

Each end of the coil 69 is connected to a control electrode of the double-triode electron tube 67 via the resistors 70 and 71. In operation, the sections of the electron tube 67 are alternately rendered conducting and the resistors 70 and 71 limit the grid current flow in such a way as to generate a substantially square switching wave between the anodes of the electron tube 67. The square switching wave is applied across a center tapped primary winding 72 of a transformer 73. A feedback circuit for the oscillator is provided by means of a secondary winding 74 of the transformer 73 which is connected to the tank circuit coil 69 via a pair of isolation resistors 75 and 76. In practice it has been found that there is a tendency for parasitic oscillation to occur in the vibrator coil 34. For this reason a damping resistor 77 and capacitor 78 are connected across the coil 34. In order to provide a return circuit from the cathode of the electron tube 67 to the tank circuit, a resistor 79 and a bypass capacitor 80 are connected in parallel between a center tap on the coil 69 and ground reference potential.

The alternating current switching wave appearing across the primary winding 72 is induced in a pair of secondary windings 81 and 82 of the transformer 73.

The reference wave generated by the oscillator is used for the purpose of driving the actuating coil 34 of the converter 11. In addition, an alternating current wave from the oscillator is applied to the synchronous demodulators in which the amplified alternating current signal is compared with the reference wave. Thus, by means of the oscillator the reference wave applied to the synchronous demodulators bears a fixed phase relationship to the opening and closing of the contacts 33 and also bears a fixed phase relationship to the alternating current signal.

A feedback circuit synchronous demodulator includes the secondary winding 81 of the transformer 73 and the secondary winding 18 of the transformer 17. Connected between the secondary windings 81 and 18 is a ring-type demodulator which includes four diodes 83, 84, 85 and 86. Each of the diodes 83–86 has a resistor 87, 88, 89, 90 connected serially therewith for the purpose of minimizing the effect of any dissimilarities in the characteristics of the diodes 83–86 and limiting the current flow therethrough. In operation, when the reference wave introduced across the secondary winding 81 is of the same phase as the alternating current signal appearing across the winding 18, a signal having low frequency components and having a unidirectional component of a given polarity appears between the center tap connections on the secondary windings 81 and 18. In contrast, when the reference wave appearing across the winding 81 is of opposite phase to the alternating current signal appearing across the winding 18, a signal appears between the center tap connections to the secondary windings 81 and 18 which includes a unidirectional component of opposite polarity to the aforementioned given polarity. The magnitude of the unidirectional component is a function of the relative amplitudes of the reference wave and the alternating current signal. Since the reference wave is of constant amplitude, the unidirectional component has a magnitude which varies in accordance with the amplitude of the alternating current signal. Thus, a signal is generated by the feedback circuit synchronous demodulator which has a polarity corresponding to the phase of the alternating current signal and a magnitude corresponding to the amplitude of the alternating current signal. Since the phase and amplitude of the alternating current signal correspond to the low frequency portions of the input signal as described above, the signal provided by the feedback circuit synchronous demodulator represents an amplified version of the portion of the input signal applied to the converter 11 including both low frequency and unidirectional components.

The signal derived from the center tap connection on the secondary windings 18 and 81 appears across an impedance matching resistor 91. The voltage appearing across the resistor 91 is applied to a voltage divider comprising the fixed resistors 92, 93 and an adjustable resistor 94. A by-pass capacitor 95 functions to filter alternating current components from the feedback voltage. By varying the adjustable resistor 94 the amount of feedback can be controlled which functions to vary the overall gain of the lower frequency range amplifier 15. The terminals 96 may be connected serially with the secondary winding 9 of the upper frequency range output transformer 8 (Fig. 1) to provide a composite feedback signal to be applied across the feedback resistor 22.

The feedback circuit is a negative or inverse feedback arrangement in which the signal appearing across the resistor 22 opposes the input signal applied to the terminals 1. A capacitor 97 returns one side of the input circuit to ground reference potential for alternating current. Since the transformers 13 and 17 are adapted to pass only alternating current signals, the feedback circuit synchronous demodulator floats with the input circuit and is conductively isolated from the remainder of the circuit and from ground reference potential.

In a similar fashion, an output signal including unidirectional and low frequency components may be derived from an output circuit synchronous demodulator which includes the secondary winding 82 of the transformer 73 and the secondary winding 19 of the transformer 17. The output circuit synchronous demodulator includes four diodes 98, 99, 100 and 101, each of which is connected serially with a resistor 102, 103, 104, 105 for the purposes of minimizing the effect of any dissimilarities in the diodes 98–101 and limiting the current flow therethrough.

Across the center tap connections to the secondary windings 82 and 19 appears a signal corresponding to the relative phases and amplitudes of the reference wave appearing across the winding 82 and the alternating current signal appearing across the winding 19. The signal appearing between the center tap connections to the windings 82 and 19 is applied to a filter circuit which includes an inductance 106 having three separate sections and the filter capacitors 107 and 108. The inductance 106 and filter capacitors 107 and 108 effectively substantially remove all alternating current signal components of the frequency of the reference wave and higher from the signal so that a signal appears at the output terminals 109 corresponding to an amplified version of the portion of the input signal applied to the converter 11. A resistor 110 is connected across the output terminals 109 to terminate the filter in a proper impedance. The terminals 109 may be connected serially with the secondary winding 10 of Fig. 1 to provide a composite output signal corresponding to the input signal applied to the terminals 1 of Fig. 1.

Although a specific demodulator circuit has been shown, it will be appreciated that other types of comparison circuits may be employed. Accordingly, the words "synchronous demodulator" as used herein, are intended to have general meaning and to cover any form of comparison circuit which is adapted to provide a signal or voltage representing a comparison between an alternating current signal and a reference wave.

The following list of electron tube types and component values is given by way of example, being indicative only of one workable embodiment:

| | |
|---|---|
| Electron tubes **39, 45, 52, 59** | Triode section of tube type 12AY7. |
| Electron tube **67** | Tube type 5687. |
| Resistors **40, 57, 66** | 100,000 ohms. |
| Resistors **41, 48, 57, 75, 76** | 1,000 ohms. |
| Resistors **44, 54, 61** | 47,000 ohms. |
| Resistors **51, 55, 62** | 470,000 ohms. |
| Resistors **70, 71** | 6,800 ohms. |
| Resistor **77** | 22 ohms. |
| Resistor **79** | 33,000 ohms. |
| Resistors **87, 88, 89, 90, 102, 103, 104, 105** | 300 ohms. |
| Resistors **91, 110** | 100 ohms. |
| Resistors **92, 93** | 15,000 ohms. |
| Resistor **94** | 10,000 ohms. |
| Capacitors **42, 49, 58** | 100 microfarads. |
| Capacitor **50** | 330 micromicrofarads. |
| Capacitor **43** | 10 microfarads. |
| Capacitors **46, 53, 60** | .1 microfarad. |
| Capacitors **68, 95, 97** | 1 microfarad. |
| Capacitor **78** | .022 microfarad. |
| Capacitor **80** | 25 microfarads. |
| Capacitors **107, 108** | 18 microfarads. |
| Coil **69** | 150 millihenries. |
| Inductance **106** | 3 sections; 90 millihenries, 180 millihenries and 90 millihenries. |

The connections made to the core symbols in the drawing for each of the transformers 13, 73 and 17 indicate that the transformers are of the type which includes an electrostatic shield for reducing capacitative coupling between the windings whereby energy is transferred by the inductive action of the transformers only.

The dashed enclosures 111, 112 and 113 surrounding the connections to the input terminals 31, the connections to the converter 11 and the connections between the feedback circuit synchronous demodulator and the resistor 91 indicate that in a preferred embodiment, shielded cables should be used with the shields being connected to ground reference potential.

It will be appreciated that a conventional heater winding is included in each of the several electron tubes 39, 45, 52, 59 and 67 for elevating the cathodes to electron emissive temperature although the actual heater symbols and connections have been omitted to simplify the drawing. Suitable voltages for energizing the heaters along with a positive operating potential may be derived from any conventional power supply (not shown). The positive operating potential may be applied to the anodes of all the electron tubes via a terminal 110.

In accordance with the invention, the exemplary embodiment includes an amplifier in which the lower frequency range components of an input signal are converted to an alternating current signal for amplification, the upper frequency range components of the input signal are separately amplified, the feedback circuit supplies a feedback voltage to the input circuit without affecting the electrical isolation of the input circuit from the remainder of the amplifier for all but alternating current signals, and the output circuit is electrically separated from the input circuit and the remainder of the amplifier for all but alternating current signals.

Although an exemplary embodiment of the invention has been illustrated and specific circuit component values have been given, the invention is not limited thereto. Accordingly, the accompanying claims are intended to include all equivalent arrangements falling within the scope of the invention.

What is claimed is:

1. An amplifier having floating input and output circuits which are conductively isolated from one another for unidirectional signal components including the combination of a first amplifier channel for amplifying electrical signals having an upper range of frequencies, a second amplifier channel for amplifying electrical signals having a lower range of frequencies, a frequency divider connected to the first and the second amplifiers for applying upper frequency range signals to the first amplifier and lower frequency range signals to the second amplifier, a negative feedback circuit connected to the input circuit and coupled to both the first and the second amplifiers for deriving a composite feedback signal including upper frequency range components and lower frequency range components, an output circuit conductively isolated from the feedback circuit for unidirectional signal components, and means coupling the output circuit to said first and second amplifiers for deriving a composite output signal including upper frequency range components and lower frequency range components.

2. An amplifier including the combination of an input circuit for receiving electrical signals over a range of frequencies encompassing an upper range of frequencies and a lower range of frequencies, a first amplifier, means coupling the first amplifier to the input circuit for the passage of electrical signals over said upper range of frequencies only, a converter, means coupling the converter to the input circuit for the passage of electrical signals having frequencies in said lower range of frequencies only, said converter being adapted to generate a modulated carrier wave in accordance with said lower range of signal frequencies, a second amplifier coupled to said converter for the passage of alternating current signals only, a first demodulator coupled to the second amplifier for the passage of alternating current signals only, a feedback circuit coupled to said first amplifier for the passage of alternating current signals only, means interconnecting the feedback circuit and the first demodulator for combining feedback signals from said first and said second amplifiers, means degeneratively connecting the feedback circuit to the input circuit, a second demodulator coupled to the second amplifier for the passage of alternating current signals only, a signal output circuit conductively isolated from the input circuit, means coupling the output circuit to the first amplifier for the passage of alternating current signals only, and means connecting the signal output circuit to the second demodulator for combining the output signal from said first amplifier with the output signal from the second demodulator to provide an amplified electrical signal having an upper range of frequencies and a lower range of frequencies corresponding to the electrical signal applied to the input circuit.

3. An amplifier including the combination of a pair of input terminals for receiving electrical signals over a range of frequencies encompassing an upper range of frequencies and a lower range of frequencies, a first alternating current amplifier coupled to the input terminals for alternating current signals within the upper range, a converter coupled to the input terminals for providing an alternating current signal of a predetermined frequency corresponding to the lower range signals, a second alternating current amplifier coupled to the converter, a source of alternating current waves of said predetermined frequency, means coupling the source of alternating current waves to the converter, at least one synchronous demodulator coupled to the second alternating current amplifier and the source of alternating current waves, a feedback circuit connected to the demodulator and coupled to the first alternating current amplifier for deriving a composite feedback signal including upper frequency range components and lower frequency range components, said feedback circuit being connected in series with the input terminals with the feedback signal being opposed to the input signals, and an output circuit conductively isolated from the input terminals for unidirectional signal components, said output circuit being coupled to the first and second alternating current amplifiers for providing a composite output signal corresponding to both the upper and lower frequency range signals applied to the input terminals.

4. An amplifier including the combination of a pair of input terminals for receiving electrical signals over a range of frequencies encompassing an upper range of frequencies and a lower range of frequencies, a frequency dividing network connected across the input terminals including a first impedance across which an upper range of signal frequencies appears and a second impedance across which a lower range of signal frequencies appears, a first alternating current amplifier coupled to the first impedance for alternating current only, a converter coupled to the second impedance for providing an alternating current signal of a predetermined frequency corresponding to the signal appearing across the second impedance, a second alternating current amplifier coupled to the converter, a source of alternating current waves of said predetermined frequency, means coupling the source of alternating current waves to the converter, a first synchronous demodulator coupled to the second alternating current amplifier and the source of alternating current waves to provide a feedback voltage, a feedback circuit connected to the first demodulator and coupled to the first alternating current amplifier for deriving a composite feedback voltage including upper frequency range components and lower frequency range components, said feedback circuit being connected in series with the input terminals with the feedback voltage being opposed to the input signals, a second synchronous demodulator coupled to the second alternating current signal amplifier and the source of alternating current waves for providing an output signal corresponding to the lower range of signal frequencies, and an output circuit conductively isolated from the input terminals for unidirectional signal components, said output circuit being connected to the second synchronous demodulator and coupled to the first alternating current amplifier for providing a composite output signal corresponding to both the upper and lower range signals applied to the input terminals.

5. An amplifier including the combination of an input circuit, a frequency dividing network connected across the input circuit including a first impedance across which an upper range of signal frequencies appears and a second impedance across which a lower range of signal frequencies appears, a first alternating current amplifier coupled to the first impedance for alternating current only, a converter coupled to the second impedance for generating an alternating current signal representing the lower range of signal frequencies, a source of alternating current reference waves, means coupling the reference wave source to the converter, at least one synchronous demodulator coupled to the second alternating current amplifier, means coupling the reference wave source to the synchronous demodulator whereby the demodulator generates a signal corresponding to the lower range of signal frequencies, a negative feedback circuit connected serially with the input terminals, means coupling the feedback circuit to the first alternating current amplifier for alternating current only, means connecting the feedback circuit to the synchronous demodulator, and means deriving a composite output signal from the first and second alternating current amplifiers, said output signal deriving means being conductively isolated from the input circuit for unidirectional signal components.

References Cited in the file of this patent

UNITED STATES PATENTS

| | | |
|---|---|---|
| 2,297,543 | Eberhardt et al. | Sept. 29, 1942 |
| 2,497,129 | Liston | Feb. 14, 1950 |
| 2,778,883 | Buckerfield | Jan. 22, 1957 |
| 2,832,848 | Neff | Apr. 29, 1958 |